(12) United States Patent
Colombo

(10) Patent No.: US 11,920,958 B2
(45) Date of Patent: Mar. 5, 2024

(54) SENSOR FRONT-END AND METHOD FOR OPERATING A SENSOR DEVICE

(71) Applicant: ams AG, Premstätten (AT)

(72) Inventor: Matteo Colombo, Verrua Po (IT)

(73) Assignee: AMS AG, Premstätten (AT)

( * ) Notice: Subject to any disclaimer, the term of this patent is extended or adjusted under 35 U.S.C. 154(b) by 143 days.

(21) Appl. No.: 17/768,611

(22) PCT Filed: Oct. 9, 2020

(86) PCT No.: PCT/EP2020/078420
§ 371 (c)(1),
(2) Date: Apr. 13, 2022

(87) PCT Pub. No.: WO2021/074033
PCT Pub. Date: Apr. 22, 2021

(65) Prior Publication Data
US 2022/0326046 A1    Oct. 13, 2022

(30) Foreign Application Priority Data
Oct. 16, 2019  (EP) .................................... 19203645

(51) Int. Cl.
*G01D 5/20*     (2006.01)
*G01D 5/14*     (2006.01)
(Continued)

(52) U.S. Cl.
CPC ............. *G01D 5/2053* (2013.01); *G01D 5/14* (2013.01); *G01D 5/24* (2013.01); *G01R 15/181* (2013.01);
(Continued)

(58) Field of Classification Search
CPC ....... G01D 5/2053; G01D 5/14; G01R 33/091
See application file for complete search history.

(56) References Cited

U.S. PATENT DOCUMENTS 6,448,759 B2 * 9/2002 Madni .................. G01D 5/2053
                                                    324/207.17
7,139,682 B2 * 11/2006 Janke ..................... G01D 3/022
                                                    702/189

(Continued)

FOREIGN PATENT DOCUMENTS

EP      0378402 A1    7/1990
EP      1019649 A1    7/2000

OTHER PUBLICATIONS

International Search Report and Written Opinion in corresponding International Application No. PCT/EP2020/078420 dated Dec. 11, 2020, 10 pages.

*Primary Examiner* — Reena Aurora
(74) *Attorney, Agent, or Firm* — MH2 TECHNOLOGY LAW GROUP LLP

(57) ABSTRACT

A sensor front-end is presented for processing a measurement signal from a sensing unit, wherein the sensing unit is configured to receive a stimulus signal from an evaluation unit of the sensor front-end, generate the measurement signal from the stimulus signal by altering an amplitude of the stimulus signal based on a measurement parameter, and provide the measurement signal to the evaluation unit. The sensor front-end comprises the evaluation unit that is configured to generate a simulated measurement signal from the stimulus signal by controlling an amplitude of the stimulus signal based on a predetermined control variable, to generate a simulated output signal based on the stimulus signal and the simulated measurement signal, and to determine an error condition based on a comparison of the simulated output signal and the predetermined control variable or a signal derived from the predetermined control variable.

18 Claims, 2 Drawing Sheets

(51) Int. Cl.
   *G01D 5/24*   (2006.01)
   *G01R 15/18*   (2006.01)
   *G01R 33/09*   (2006.01)
   *H02K 11/215*   (2016.01)

(52) U.S. Cl.
   CPC ......... *G01R 33/091* (2013.01); *H02K 11/215* (2016.01); *G01D 2205/20* (2021.05)

(56) References Cited

U.S. PATENT DOCUMENTS

| | | | |
|---|---|---|---|
| 8,533,136 B1* | 9/2013 | Xu | G06F 30/367 |
| | | | 706/45 |
| 2012/0319473 A1 | 12/2012 | Tzivanopoulos et al. | |
| 2019/0285437 A1* | 9/2019 | Utermoehlen | G01D 5/2046 |

* cited by examiner

SENSOR FRONT-END AND METHOD FOR OPERATING A SENSOR DEVICE

CROSS-REFERENCE TO RELATED APPLICATIONS

The present application is the national stage entry of International Patent Application No. PCT/EP2020/078420, filed on Oct. 9, 2020, and published as WO 2021/074033 A1 on Apr. 22, 2021, which claims the benefit of priority of European Patent Application No. 19203645.7, filed on Oct. 16, 2019, all of which are incorporated by reference herein in their entireties.

FIELD OF THE INVENTION

The present disclosure relates to a sensor front-end for processing a measurement signal from a sensing unit and to a method for operating a sensor device.

BACKGROUND OF THE INVENTION

Sensors are typically divided into a sensing unit and a sensor front-end. The sensing unit in these sensors senses a specific quantity, e.g. a magnitude of an electric or a magnetic field at the location of the sensor, and converts this into a measurement signal. The front-end then processes this measurement signal and generates an output signal, for example a digital signal representing a value of the measured quantity.

For many applications, a reliable performance of the sensor is absolutely essential. These applications include automotive systems in which position sensors are employed to measure the adjustment of control elements. For example, position encoders are used to measure a deflection of the steering wheel or paddles of a vehicle. Malfunctioning of the sensor, i.e. the processing of the measurement signal, in these applications easily constitutes a severe safety hazard. Therefore, an error detection feature may be implemented that monitors the functionality of the sensor.

Typically, sensors comprise a chain of elements in the front-end for processing the measurement signal. Conventional sensors with an error detection feature employ dedicated monitors for each of these elements, hence creating a significant degree of redundancy which results in an inefficient error detection mechanism and high energy consumption.

An object to be achieved is to provide an improved concept for an error detection of a sensor front-end that is capable of determining whether the signal processing operates reliably without producing errors.

This object is achieved with the subject-matter of the independent claims. Embodiments and developments of the improved concept are subject-matter of the dependent claims.

SUMMARY OF THE INVENTION

The improved concept is based on the idea of fabricating, by means of the sensor front-end, a simulated measurement signal based on a predetermined quantity in order to mimic an actual measurement measured by a sensing unit of a sensor device. The improved concept further comprises processing the simulated measurement signal to generate a simulated output signal, and comparing the simulated output signal to the predetermined quantity. Based on this comparison, an error condition of the sensor front-end can be determined. For example, the sensor is determined to function properly if the simulated output signal is within a specific range of the predetermined quantity.

In particular, a sensor front-end according to the improved concept is configured to process a measurement signal from a sensing unit. The sensing unit is configured to receive a stimulus signal from an evaluation unit of the sensor front-end, generate the measurement signal from the stimulus signal by altering an amplitude of the stimulus signal based on a measurement parameter, and provide the measurement signal to the evaluation unit.

The sensor front-end according to the improved concept comprises the evaluation unit that is configured to generate the stimulus signal, and generate an output signal based on the stimulus signal and the measurement signal received from the sensing unit. The evaluation unit is further configured to generate a simulated measurement signal from the stimulus signal by controlling an amplitude of the stimulus signal based on a predetermined control variable, generate a simulated output signal based on the stimulus signal and the simulated measurement signal, and to determine an error condition based on a comparison of the simulated output signal and the predetermined control variable or a signal derived from the predetermined control variable.

The sensor front-end is, for example, configured to operate a sensing unit that generates a measurement signal by altering an amplitude of a stimulus signal that is provided to the sensing unit. The sensing unit can be an inductive or capacitive sensing unit, for example. Accordingly, the stimulus signal generated by the evaluation unit of the front-end is an alternating electrical signal, for example a sinusoidal signal with a predetermined amplitude and frequency in the kilohertz or megahertz range, for instance. The measurement signal generated by the sensing unit corresponds to the stimulus signal in terms of frequency, however, its amplitude depends on a value of the measurement parameter. For example, for a periodically changing measurement parameter, the measurement signal corresponds to the stimulus signal with an oscillating envelope function. Hence, the measurement signal can be understood as an amplitude modulated version of the stimulus signal in this case.

The evaluation unit of the sensor front-end processes the measurement signal received from the sensing unit for generating an output signal. For example, the evaluation unit is configured to compare the measurement signal with the stimulus signal and generate the output signal based on this comparison. The evaluation unit can be configured to demodulate the measurement signal with the stimulus signal for generating the output signal.

In order to realize an error detection, the evaluation unit is further configured to generate a simulated measurement signal from the stimulus signal based on a predetermined control variable. For example, the predetermined control variable corresponds to a simulated measurement parameter. In other words, the evaluation unit simulates a measurement response from the sensing unit without involving the latter. Analogous to the measurement signal from the sensing unit, the simulated measurement signal corresponds to the stimulus signal in terms of frequency, however, its amplitude depends on a value of the predetermined control variable, i.e. the simulated measurement parameter.

The evaluation unit is configured to process the simulated measurement signal in the same manner as an actual measurement signal from the sensing unit. In other words, the evaluation unit is configured to generate a simulated output signal from the simulated measurement signal and the stimulus signal. For example, generating the simulated output signal comprises demodulating the simulated measurement signal using the stimulus signal, and analyzing an amplitude of the resulting demodulated signal.

For determining an error condition, the evaluation unit is configured to compare the simulated output signal to the predetermined control variable or to a signal derived from the predetermined control variable. For example, the evaluation unit is configured to compare the simulated output signal to the simulated measurement parameter, based on which the simulated measurement signal was generated.

The measurement parameter corresponds to a position and/or an orientation of an object that is arranged in the vicinity of the sensing unit, for instance. For example, the measurement parameter corresponds to or is a quantity of a source field, in particular of an electric or a magnetic source field, at a location of the sensing unit.

The object in these embodiments can be characterized by a position and/or orientation dependent source field. For example, a magnetic or electric field strength at the location of the sensing unit depends on a position and/or orientation of the object. In other words, the position and/or orientation of the object determines the field strength at the location of the sensing unit. In this sense, the object can either emit its own source field or influence an external source field, for example via a specific polarity regarding electric charges and/or magnetization of the object. An external source field may be generated by means of the sensing unit, e.g. by means of primary inductors.

In some embodiments, the measurement parameter corresponds to a position of a movable object, in particular to a rotation angle of a rotatable shaft.

For example, the sensor is a rotary encoder and configured to determine an angle of a rotatable object, such as a shaft. To this end, the shaft may influence a source field strength at the location of the sensing unit, wherein the strength of the source field is dependent on the rotation angle. Alternatively, the sensor is a linear position encoder and configured to determine a displacement of a movable object, such as a shaft, along the main axis of the object. In this case, the magnitude of the source field at the location of the sensing unit is dependent on the displacement.

In some embodiments, the sensor front-end is configured to process a measurement signal from an inductive sensing unit.

The sensing unit in these embodiments comprises at least one inductor that generates the measurement signal based on a magnetic field at the location of the inductor. As a stimulus signal, e.g. a sinusoidal stimulus signal, is applied to the inductor, the resulting measurement signal corresponds to the stimulus signal with an altered amplitude that depends on the magnitude and/or orientation of the magnetic field that is influenced by a movable object, for instance, at the location of the inductor. The sensor front-end in these embodiments is configured to process the measurement signal and convert it to a value for the magnetic field strength which in turn corresponds to an orientation and/or position of said movable object as described above, for instance.

In alternative embodiments, the sensor front-end is configured to process a measurement signal from a capacitive sensing unit.

The sensing unit in these embodiments comprises at least one capacitor that generates the measurement signal based on a capacitance that is dependent on an electric field at the location of the capacitor, for instance. Analogous to the embodiment with the inductor described above, the resulting measurement signal from the capacitive sensing unit corresponds to the stimulus signal with an altered amplitude that depends on the magnitude and/or orientation of the electric field at the location of the capacitor. The sensor front-end in these embodiments is configured to process the measurement signal and convert it to a value for the electric field strength which corresponds to an orientation and/or position of a movable object as described above, for instance.

In some embodiments, the evaluation unit is further configured to generate the output signal as a series of output values that each are generated from the stimulus signal and the measurement signal at a clock rate of the sensor front-end.

A measurement signal taken over a time delta can have a varying amplitude, e.g. due to a periodically changing measurement parameter. Such a measurement signal can be processed by means of the evaluation unit in order to determine a change in the measurement parameter over said time delta. For example, the measurement signal is an analog signal with a frequency corresponding to a frequency of the stimulus signal and an amplitude that depends on the measurement parameter. The measurement signal is evaluated at a clock rate of the sensor front-end, which can be in the order of μs or ms. This leads to the output signal comprising a number of output values, each indicating an amplitude of the measurement signal at the respective time of evaluation. In other words, the output signal is a digitized version of the amplitude of the measurement signal, for instance. Further processing of such an output signal can be performed for determining a differential of the measurement signal.

For example, if the sensor is configured as a rotary position encoder, a measurement signal acquired over a time delta can be processed by means of the evaluation unit such that the output signal indicates a rotation angle of a rotatable object over time.

In some further embodiments, the evaluation unit is further configured to generate the simulated output signal as a series of simulated output values that each are generated from the stimulus signal and the simulated measurement signal at the clock rate of the sensor front-end.

For example, for generating the simulated measurement signal, the amplitude of the stimulus signal can be controlled by a set of control variables. In this sense, a simulated measurement signal with a changing amplitude can be fabricated. Analogous to the embodiment described above, the evaluation unit in these embodiments is configured to process a simulated measurement signal taken over a time delta in the same manner as a measurement signal received from the sensing unit. In particular, the simulated measurement signal is an analog signal with a frequency corresponding to a frequency of the stimulus signal and an amplitude that depends on the set of control variables. For example, the simulated measurement signal is fabricated to have an amplitude modulation by means of a periodic set of control variables.

The simulated measurement signal is likewise evaluated at a clock rate of the sensor front-end, as described above. This leads to the simulated output signal comprising a number of simulated output values, each indicating an amplitude of the simulated measurement signal at the respective time of evaluation. In other words, the simulated output signal is a digitized version of the amplitude of the simulated measurement signal, for instance. The evaluation unit is in these embodiments further configured to determine the error condition based on a comparison of the simulated output signal with the set of control variables or a signal derived from the set of control variables.

The evaluation unit can further be configured to determine a further error condition based on a comparison of the number of simulated output values and the set of control variables or of signals derived from these two groups. For example, the simulated measurement value constitutes a certain predetermined evolution of a fabricated measurement parameter, such as a changing rotation angle of an object, and the further error condition evaluates whether the simulated output signal reflects said predetermined evolution.

Further processing of such a simulated output signal can be performed for determining a differential of the simulated measurement signal. Based on this differential, the evaluation unit may further be configured to determine a further error condition, e.g. indicating whether a change of the simulated output signal is within a range defined by a change of the set of control variables.

In some embodiments, the evaluation unit comprises an oscillator for generating the stimulus signal.

For example, the stimulus signal is generated by means of an oscillating circuit, such as an LC oscillator operated at its resonance frequency, of the evaluation unit, wherein the oscillating circuit is capable of generating a sinusoidal oscillation with a predetermined amplitude and frequency in the kHz or MHz range. Such a high frequency stimulus signal enables a sufficient resolution for a measurement for most applications, as clock frequencies of sensor front-ends typically are in the kHz range.

In some embodiments, the evaluation unit comprises a variable attenuator for generating the simulated measurement signal from the stimulus signal.

Based on a predetermined control variable that can correspond to a specific degree of attenuation, the variable attenuator can be configured to generate the simulated measurement signal by adjusting, i.e. attenuating, the amplitude of the stimulus signal in a determined manner. A set of control variables can realize a desired varying envelope function in order to generate a simulated differential signal for some embodiments of the sensor front-end. For example, the variable attenuator is realized by means of a capacitive or a resistive ladder.

In some embodiments, determining the error condition further comprises comparing a deviation of the simulated measurement signal and the predetermined control variable or a signal derived from the predetermined control variable to a predetermined threshold stored in a memory of the evaluation unit.

Typically, sensors are not required to perform an exact measurement of a measurement parameter but are considered accurate if the output value lies within a specific range around the actual measurement value for most applications. To this end, a deviation between the simulated output signal and the control variable, or a signal derived from the control variable, can be compared to a threshold by means of the evaluation unit in order to determine an error condition, i.e. whether the signal processing of the sensor front-end is operating reliably.

The object is further solved by a position sensor comprising a sensor front-end according to one of the embodiments described above. The position sensor is configured as a position encoder, in particular as a linear or a rotary position encoder.

The aforementioned object is further solved by a control element of an automotive vehicle comprising a position sensor as described above.

Such control elements include the steering wheel, handlebars as well as gas and brake pedals of a vehicle. A position sensor that is configured as a position encoder can hence reliably determine a position, orientation and/or displacement of such control elements. In all these applications, reliable error monitoring of the sensor is realized by means of the embodiments of the sensor front-end according to the improved concept.

The aforementioned object is further solved by a method for operating a sensor device. The method comprises generating, by means of an evaluation unit, a stimulus signal and providing the stimulus signal to a sensing unit. The method further comprises generating, by means of the sensing unit, a measurement signal from the stimulus signal by adjusting an amplitude of the stimulus signal based on a measurement parameter, and providing the measurement signal to the evaluation unit. The method further comprises generating, by means of the evaluation unit, an output signal based on the stimulus signal and the measurement signal.

The method according to the improved concept further comprises generating, by means of the evaluation unit, a simulated measurement signal from the stimulus signal by controlling an amplitude of the stimulus signal based on a predetermined control variable, and generating a simulated output signal based on the stimulus signal and the simulated measurement signal. The method further comprises determining an error condition based on a comparison of the simulated output signal and the predetermined control variable or a signal derived from the predetermined control variable.

In some embodiments of the method, generating the output signal and/or the simulated output signal comprises demodulation using a stimulus signal.

Further embodiments of the method for operating a sensor device become apparent to a person skilled in the art from the embodiments of the sensor front-end described above.

BRIEF DESCRIPTION OF THE DRAWINGS

The improved concept will be described in more detail in the following with the aid of drawings. Elements having the same or similar function bear the same reference symbols throughout the drawings. Hence their description is not necessarily repeated in the description of the following drawings.

DETAILED DESCRIPTION

Figure 1:
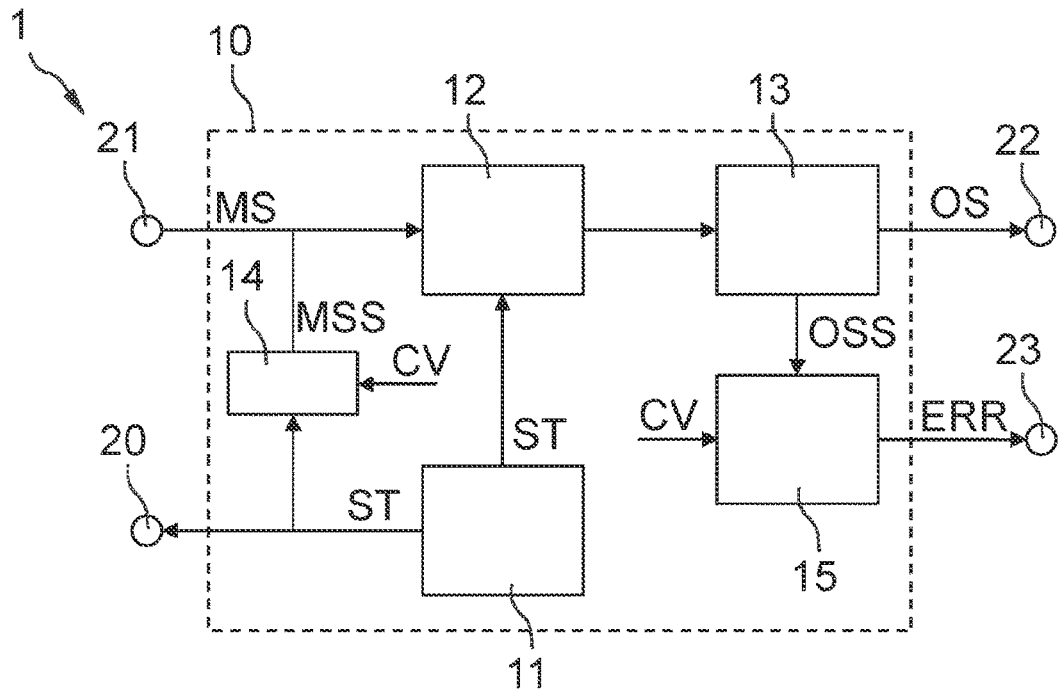
FIG. 1 shows a schematic of an exemplary embodiment of a sensor front-end according to the improved concept.

FIG. 1 shows a schematic of a sensor front-end 1 according to the improved concept for processing a measurement signal ms from a sensing unit. The sensor front-end 1 comprises an evaluation unit 10 that is configured to provide a stimulus signal ST to the sensing unit via a sensor output 20 of the sensor front-end 1 and to receive from the sensing unit a measurement signal MS via a sensor input 21 of the sensor front-end 1. The evaluation unit 10 is further configured to provide an output signal OS via an output 22 and an error condition signal ERR via an error output 23 of the sensor front-end 1.

The evaluation unit 10 comprises a signal generator 11 for generating the stimulus signal ST. For example, the signal generator 11 is an oscillator such as an LC oscillator circuit.

The stimulus signal ST is a sinusoidal signal characterized by a stimulus amplitude and a stimulus frequency. For example, the stimulus frequency is in the range between 1 kHz and 100 MHz. For example, it is in the order of 1 MHz.

The sensing unit that is to be operated by the sensor front-end 1 is for example an inductive sensing unit and comprises a first inductor that is connected to the sensor output 20 of the sensor front-end 1 and is configured to produce a changing magnetic field based on the stimulus signal ST according to Faraday's law of induction. The sensing unit can comprise a second inductor that is exposed to the changing magnetic field and connected to the sensor input 21 of the sensor front-end 1. The second inductor is configured to generate the measurement signal MS according to the law of induction based on the changing magnetic field from the first inductor.

The measurement signal MS corresponds to the stimulus signal ST, however, is altered, i.e. attenuated, in terms of its amplitude based on a measurement parameter, which for example corresponds to the distance between the first and the second inductors. In other words, the sensing unit can be understood as a transformer that is sensitive to a distance between the first and the second inductors. The inductors are coils, for instance. For a periodically changing distance, the measurement signal MS is a sinusoidal signal with the stimulus frequency and an amplitude modulation that corresponds to the change of the distance, for example. Alternatively, the measurement signal MS can be a sinusoidal signal with constant amplitude and a frequency modulation.

Alternatively, the inductive sensing unit solely comprises one inductor and the measurement signal MS corresponds to a current in said inductor that depends on a distance to a metallic object and the proximity of the coil. In further alternatives, the sensing unit can be a capacitive sensing unit.

The evaluation unit 10 further comprises a demodulator 12 that is configured to receive and demodulate the measurement signal MS using the stimulus signal ST. For example, the demodulator 12 is configured to perform amplitude or frequency demodulation on the measurement signal MS. The demodulated signal is provided to a processing unit 13 that is configured to generate the output signal OS from the demodulated signal. The processing unit 13 comprises a chain of elements including a gain and/or offset compensation element, an AD, analog and digital filters, and a pulse-width modulator, for instance. For example, the output signal OS corresponds to a digitized value of the measurement parameter. The output signal OS is provided to the output 22 of the sensor front-end 1 for further signal processing and/or evaluation, for instance.

The evaluation unit 10 further comprises a variable attenuator 14 that is configured to generate a simulated measurement signal MSS from the stimulus signal ST based on a predetermined control variable CV. For example, the variable attenuator 14 is configured to alter, e.g. attenuate, the amplitude of the stimulus signal ST depending on a value of the control variable CV. In other words, the simulated measurement signal MSS can be understood as a fabricated measurement signal generated from a fabricated measurement parameter, i.e. the control variable CV. For example, the control variable CV is constant, hence leading to a constant amplitude of the simulated measurement signal MSS, or periodically changes, leading to an amplitude modulated simulated measurement signal MSS. For example, the variable attenuator 14 comprises a resistive and/or capacitive ladder.

As the simulated measurement signal MSS is of the same nature as the measurement signal MS, the evaluation unit 10 can process the simulated measurement signal MSS in the same way for generating a simulated output signal OSS. In other words, the evaluation units 10 performs demodulation by means of the demodulator 12 and further processing by means of the processing unit 13 for generating the simulated output signal OSS.

In the embodiment shown, the simulated output signal OSS is provided to a comparison unit 15 that is configured to determine an error condition based on a comparison of the simulated output signal OSS and the predetermined control variable CV. Analogous to the output signal OS, the simulated output signal OSS corresponds to a digitized value of the fabricated measurement parameter, i.e. the control variable CV, for instance. For example, the comparison unit 15 is configured to determine whether the simulated output signal OSS lies within a predetermined range or interval that depends on the predetermined control variable CV. In other words, the comparison unit 15 is configured to determine the error condition based on a deviation between the simulated output signal OSS and to the predetermined control variable CV. Predetermined thresholds, ranges and/or intervals can be dependent on a value of the predetermined variable and be stored in a memory unit of the evaluation unit 10.

The evaluation unit 10 can be configured to generate an output signal OS and/or a simulated output signal OSS once within a specified measurement time, which is in the order of 1 ms, for instance. The evaluation unit 10 can further be configured to generate a differential output signal and/or a simulated differential signal based on a change of the measurement parameter and/or the control variable CV. The differential output signal and/or the simulated differential signal corresponds to a series of measurement parameters and/or the control variables CV within a time delta, for instance the specified measurement time.

The error condition signal ERR is for example an error flag that indicates an error if the simulated output signal OSS is outside the predetermined range, or no error otherwise. In other embodiments, both the simulated output signal OSS and the predetermined control variable CV can be provided to an external error unit for determining the error condition. In order to test a reliability in determining the error condition, the evaluation unit 10 can be configured to intentionally fabricate an error condition, for example via comparing the simulated output signal OSS to a control variable CV that is different from that used to generate the simulated measurement signal MSS by means of the variable attenuator 14.

Figure 2:
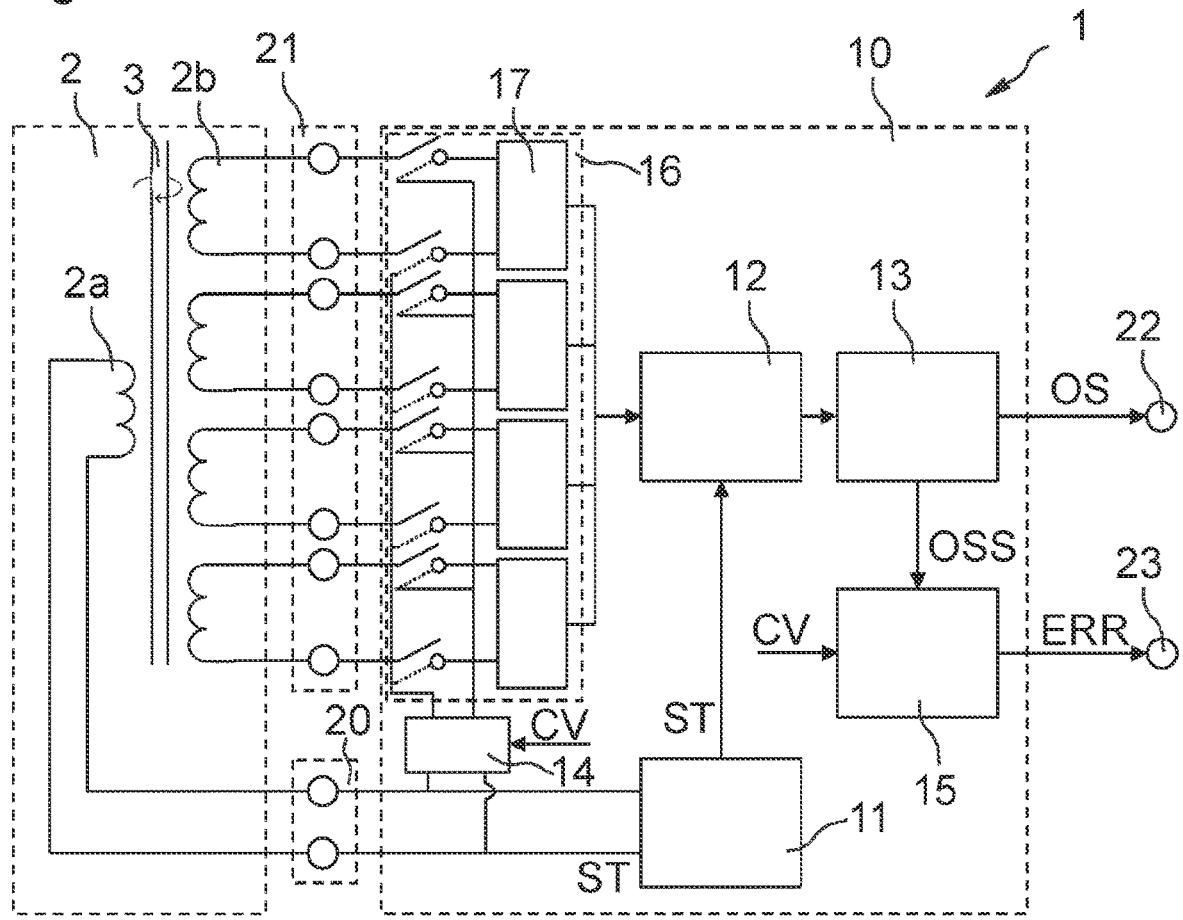
FIG. 2 shows a schematic of an exemplary embodiment of a sensor device comprising a sensor front-end according to the improved concept.

FIG. 2 shows a schematic of a sensor device comprising a sensor front-end 1 according to the improved concept and a sensing unit 2 that is operated by the sensor front-end 1.

The sensor device shown is a position sensor such as a position encoder, for instance. The sensing unit 2 comprises a primary inductor 2a and a number of secondary inductors 2b. The primary inductor 2a is connected to the sensor output 20, as described above, for generating a magnetic field based on the stimulus signal ST according to the law of induction. The secondary inductors 2b are arranged at different locations with respect to the primary inductor 2a such that each of the secondary inductors 2b detects the magnetic field at its location and generates a measurement signal by means of induction based on said detected magnetic field.

The magnetic field at the location of the secondary inductors 2b can depend on an arrangement of a metallic object 3 in the proximity of the secondary inductors 2b. For example, the metallic object 3 is a rotatable shaft with a non-uniform magnetization with respect to its cross-section, for instance. The rotation capability is indicated by the arrow in FIG. 2. A rotation of the metallic object 3 hence changes the magnetic field at the location of the secondary inductors 2b such that the generated measurement signal can be an indicator for an orientation, e.g. a rotation angle, of the metallic object 3. Due to the sensing unit being configured to determine a rotation angle of the metallic object 3 in this embodiment, the position sensor can be understood as a rotary position encoder.

In order for the evaluation units 10 of the sensor front-end 1 to be able to process the measurement signals MS from each of the secondary inductors 2b, i.e. from each sensor input channel, the evaluation unit 10 in this embodiment further comprises a switching unit 16 for selecting a measurement signal MS from a respective one of the sensor inputs 21. The switching unit 16 can comprise electronic components 17 including demodulators, filters and/or analog-to-digital converters, for instance, for each of the sensor input channels. The switching unit 16 in the embodiment shown is further configured to select the simulated measurement signal MSS from the variable attenuator 14 as input signal for all channels, individually or simultaneously, in case a functionality and/or performance of the sensor front-end is to be verified. The sensor front and 10 can be configured to generate an output signal OS for each of the measurement signals MS from the secondary inductors 2b. Alternatively the evaluation unit 10, in particular the processing unit 13 can be configured to generate a single output signal OS from the measurement signals MS. Determining a rotation angle of a metallic shaft by means of a rotary encoder with secondary inductors 2b arranged symmetrically around a rotatable object is a well-known concept for a person skilled in the art, and therefore is not further discussed at this point.

Alternative to the rotary encoder shown, the sensing unit 2 can be configured as a linear position encoder. Also instead of inductors, the sensing unit may comprise capacitors to realize a capacitive sensing unit, e.g. for detecting changes of an electric field.

A sensor front-end 1 according to one of the embodiments shown may be conveniently employed in a sensor device that requires error monitoring for verifying the output of correctly processed measurement signals. Possible applications include linear and rotary position encoders used, for example, in automotive vehicles for detecting orientations and/or deflection of control elements.

Figure 3:
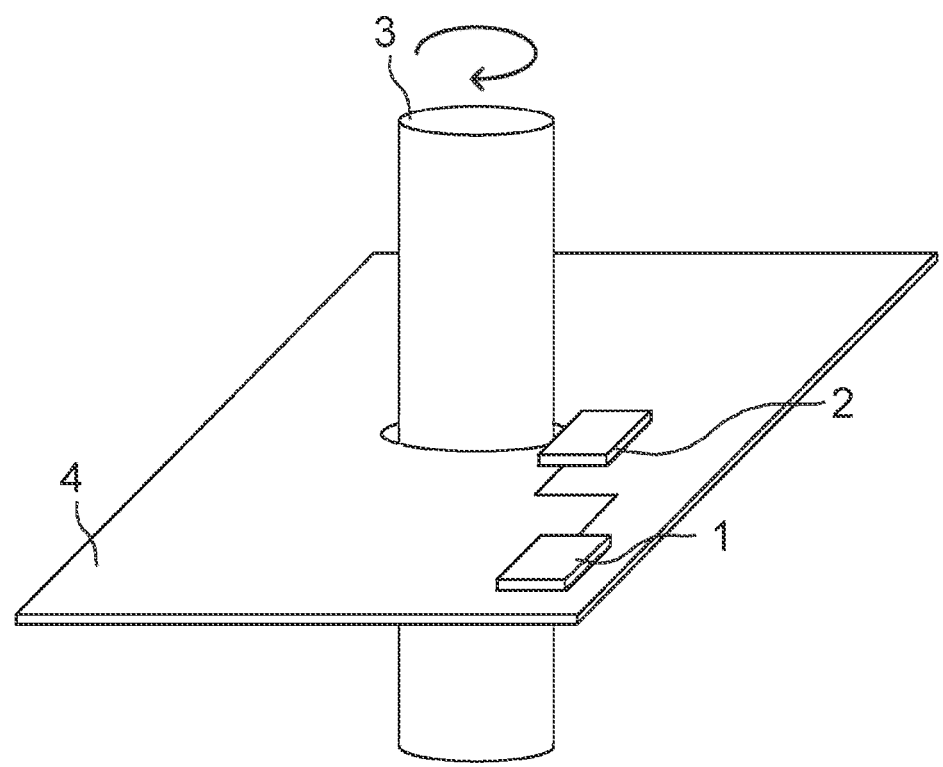
FIG. 3 shows an application of a sensor comprising a sensor front-end according to the improved concept.

A specific application of a sensor device comprising a sensor front-end 1 according to the improved concept is illustrated in FIG. 3, in which the sensing unit 2 of the sensor device is designed as a rotary encoder and configured to monitor a rotation angle of a shaft 3 that is connected to a steering wheel or a handle bar of an automotive vehicle, for instance. In the exemplary embodiment shown, the sensor front-end 1 and the sensing unit 2 are arranged on a common substrate 4, which can be a circuit board.

Other applications include the monitoring of deflections of acceleration and brake pedals, for instance via a sensor device that is designed as a linear encoder.

The error monitoring realized by means of fabricating a simulated measurement signal and monitor its correct processing, as described throughout this disclosure, can be triggered at a predefined rate, e.g. once after processing an actual measurement from the sensing unit or regularly after a certain number of actual measurements.

The embodiments of the sensor front-end 1 shown in the figures represent exemplary embodiments, therefore they do not constitute a complete list of all embodiments according to the improved concept. Actual tuning arrangements may vary from the embodiments shown in terms of additional components and configuration, for instance.

The invention claimed is:

1. A sensor front-end for processing a measurement signal from a sensing unit, the sensing unit being configured to receive a stimulus signal from an evaluation unit of the sensor front-end, generate the measurement signal from the stimulus signal by altering an amplitude of the stimulus signal based on a measurement parameter, and provide the measurement signal to the evaluation unit, the sensor front-end comprising the evaluation unit that is configured to
generate the stimulus signal;
generate an output signal based on the stimulus signal and the measurement signal received from the sensing unit;
generate a simulated measurement signal from the stimulus signal by controlling an amplitude of the stimulus signal based on a predetermined control variable;
generate a simulated output signal based on the stimulus signal and the simulated measurement signal; and
determine an error condition based on a comparison of the simulated output signal and the predetermined control variable or a signal derived from the predetermined control variable.

2. The sensor front-end according to claim 1, wherein the measurement parameter is a quantity of a source field, in particular of an electric or a magnetic source field, at a location of the sensing unit.

3. The sensor front-end according to claim 1, wherein the measurement parameter corresponds to a position of a movable object, in particular to a rotation angle of a rotatable shaft.

4. The sensor front-end according to claim 1, wherein the sensor front-end is configured to process a measurement signal from an inductive sensing unit.

5. The sensor front-end according to claim 1, wherein the sensor front-end is configured to process a measurement signal from a capacitive sensing unit.

6. The sensor front-end according to claim 1, wherein the evaluation unit is further configured to generate the output signal as a series of output values that each are generated from the stimulus signal and the measurement signal at a clock rate of the sensor front-end.

7. The sensor front-end according to claim 6, wherein the evaluation unit is further configured to generate the simulated output signal as a series of simulated output values that each are generated from the stimulus signal and the simulated measurement signal at the clock rate of the sensor front-end.

8. The sensor front-end according to claim 1, wherein the evaluation unit comprises a signal generator for generating the stimulus signal.

9. The sensor front-end according to claim 1, wherein the evaluation unit comprises a variable attenuator for generating the simulated measurement signal from the stimulus signal.

10. The sensor front-end according to claim 1, wherein determining the error condition further comprises comparing a deviation of the simulated output signal and the predetermined control variable or a signal derived from the predetermined control variable to a predetermined threshold stored in a memory of the evaluation unit.

11. The sensor front-end according to claim 1, wherein the stimulus signal is an alternating electrical signal, in particular a sinusoidal signal, with a predetermined amplitude and frequency.

12. The sensor front-end according to claim 1, wherein the predetermined control variable corresponds to a simulated measurement parameter of the sensing unit.

13. The sensor front-end according to claim 1, wherein the simulated measurement signal constitutes a simulated measurement response of the sensing unit.

14. The sensor front-end according to claim 1, wherein determining the error condition comprises comparing the simulated output signal to a simulated measurement parameter of the sensing unit.

15. The sensor front-end according to claim 1 and a sensing unit, wherein the position sensor is configured as a position encoder, in particular as a rotary encoder.

16. A control element of an automotive vehicle comprising a position sensor according to claim 15.

17. A method for operating a sensor device, the method comprising generating by means of an evaluation unit a stimulus signal;

providing the stimulus signal to a sensing unit;

generating by the sensing unit a measurement signal from the stimulus signal by adjusting an amplitude of the stimulus signal based on a measurement parameter; and providing the measurement signal to the evaluation unit; and generating by the evaluation unit an output signal based on the stimulus signal and the measurement signal;

wherein the method further comprises generating by the evaluation unit a simulated measurement signal from the stimulus signal by controlling an amplitude of the stimulus signal based on a predetermined control variable;

generating a simulated output signal based on the stimulus signal and the simulated measurement signal; and determining an error condition based on a comparison of the simulated output signal and the predetermined control variable or a signal derived from the predetermined control variable.

18. The method according to claim 17, wherein generating the output signal and/or the simulated output signal comprises demodulation using the stimulus signal.

\* \* \* \* \*